(12) United States Patent
Hosler

(10) Patent No.: US 9,541,839 B2
(45) Date of Patent: Jan. 10, 2017

(54) METHOD AND DEVICE FOR SPLITTING A HIGH-POWER LIGHT BEAM TO PROVIDE SIMULTANEOUS SUB-BEAMS TO PHOTOLITHOGRAPHY SCANNERS

(71) Applicant: GLOBALFOUNDRIES Inc., Grand Cayman (KY)

(72) Inventor: Erik Robert Hosler, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 154 days.

(21) Appl. No.: 14/637,459

(22) Filed: Mar. 4, 2015

(65) Prior Publication Data

US 2016/0259251 A1    Sep. 8, 2016

(51) Int. Cl.
*H05G 2/00* (2006.01)
*G03F 7/20* (2006.01)

(52) U.S. Cl.
CPC .......... *G03F 7/70033* (2013.01); *H05G 2/008* (2013.01)

(58) Field of Classification Search
CPC ............................ G03F 7/70033; H05G 2/008
USPC ....................................................... 250/504 R
See application file for complete search history.

(56) References Cited

U.S. PATENT DOCUMENTS

2016/0165710 A1\* 6/2016 Hosler ................... H05G 2/008
                                                              250/504 R \* cited by examiner

*Primary Examiner* — Michael Maskell
(74) *Attorney, Agent, or Firm* — Ditthavong & Steiner, P.C.

(57) ABSTRACT

Methods for receiving a high-energy EUV beam and distributing EUV sub-beams to photolithography scanners and the resulting device are disclosed. Embodiments include receiving a high-energy primary EUV beam at a primary splitting optical assembly; splitting the primary EUV beam into primary EUV sub-beams; reflecting the primary EUV sub-beams to beam-splitting optical arrays; splitting the primary EUV sub-beams into secondary EUV sub-beams; reflecting the secondary EUV sub-beams to EUV distribution optical arrays; and distributing simultaneously the secondary EUV sub-beams to scanners.

20 Claims, 7 Drawing Sheets

BACKGROUND

BACKGROUND

BACKGROUND

BACKGROUND

METHOD AND DEVICE FOR SPLITTING A HIGH-POWER LIGHT BEAM TO PROVIDE SIMULTANEOUS SUB-BEAMS TO PHOTOLITHOGRAPHY SCANNERS

TECHNICAL FIELD

The present disclosure relates generally to designing and fabricating integrated circuit (IC) devices. The present disclosure is particularly applicable to providing high-energy light beams in the electromagnetic spectrum utilized in photolithographic patterning in fabrication of IC devices at 10 nanometer (nm), 7 nm, 5 nm nodes and beyond.

BACKGROUND

Generally, in fabrication of an IC device, a photolithography (or lithography) process may be utilized to print/pattern various layers of a circuit design onto a surface of a silicon (Si) substrate for creating various devices (e.g., transistors) and circuits to form the IC device. In lithography, typically a ultra-violet (UV) light/beam is radiated onto a photomask, which may mask or expose areas on the substrate that are to be blocked from or patterned by the UV light, respectively. With continued progress of the semiconductor industry toward shrinking technology nodes and a high-volume manufacturing model, a need exists to shrink the wavelength used for photolithography in order to print higher resolution features. One such wavelength to achieve this scaling is in the extreme UV (EUV) region of the electromagnetic spectrum; hence a need exists for a compatible EUV source of sufficient power and subsequent distribution system. However, development and implementation of such systems have been slow. Although a single-source high-power free-electron laser (FEL) system, which is widely deployed around the world at scientific user facilities, may be utilized to provide EUV light, challenges such as compatibility of a FEL system with a fabrication facility (fab), total output power, economic considerations, and the like remain. Additionally, distribution of EUV light from a single high-power source to multiple scanners (e.g., associated with multiple photomasks) without a significant loss (e.g., absorption of EUV light by elements in the system) is inherently challenging.

FIG. 1A illustrates example components of a FEL and a beam distribution network. A FEL is divided into several key components, namely the linear accelerator (Linac) and radiator/end station. The Linac is composed of an electron (e) source, a gun/injector 101, and a series of electron accelerators 103, which are typical superconducting radio frequency (SRF) cavities. The electron gun/injector defines the parameters of the generated electrons, while the SRF cavities accelerate the electrons to relativistic speeds. For an FEL, undulators 105 are used to oscillate the electrons thereby generating radiation proportional to the undulator period and magnetic strength for a given electron beam energy. After the undulators 105, the electron beam is either dumped at 107 or recycled and the generated radiation is utilized at the designated end station. In lithography, a beam distribution network 109 may be utilized to distribute EUV sub-beams 111 to EUV scanners 113.

FIGS. 1B through 1D illustrate example light distribution networks associated with a photolithography process. FIG. 1B illustrates an undulator switchyard network that may be utilized to split an FEL beam. By passing the beam through a plurality of undulators 115, consisting of a series of alternating polarity magnets, and electron beam switches 117, which are selectable polarity magnets used to direct the electron beam to each undulator, the beam may oscillate according to the magnetic field direction of each undulator and can produce multiple isolated EUV photon beams 119 for distribution to multiple scanners. However, issues associated with an undulator switchyard network include a high cost and a complex design for manipulating the electron beam through the undulators. FIG. 1C illustrates a time-multiplexing network where a series of mirrors 121 may be utilized to reflect a single EUV beam 123 onto a series of scanners 125 one at a time. However, as the EUV beam may be reflected only to one scanner at a time, this method could not support the simultaneous use of multiple scanners in a high volume manufacturing process. FIG. 1D illustrates a split edge mirrors network where a focused EUV beam 127 may be reflected onto a mirror 129 that is at a grazing incidence angle (less than 30 degrees relative to the surface), wherein an edge of the mirror may reflect a portion of the EUV beam to a scanner corresponding to that mirror. In this network, a plurality of mirrors may be utilized to provide simultaneous EUV beams to corresponding scanners. However, there could be substantial loss in power of the reflected EUV beams where the loss may be due to manufacturing and polishing techniques in the optical industry, high surface roughness and non-uniformity at the edges of the mirrors, or the like issues that could reduce reflectivity of the EUV beams at the edges of the mirrors.

A need therefore exists for a methodology for splitting a high-power FEL beam and, without substantial power loss, providing simultaneous EUV beams to photolithography scanners.

SUMMARY

An aspect of the present disclosure is a method for splitting a high-power FEL beam and, without substantial power loss, providing simultaneous EUV beams to photolithography scanners.

Another aspect of the present disclosure is a device enabling splitting of a high-power FEL beam and, without substantial power loss, providing simultaneous EUV beams to photolithography scanners.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure some technical effects may be achieved in part by a method including: receiving a high-energy primary EUV beam at a primary splitting optical assembly; splitting the primary EUV beam into primary EUV sub-beams; reflecting the primary EUV sub-beams to beam-splitting optical arrays; splitting the primary EUV sub-beams into secondary EUV sub-beams; reflecting the secondary EUV sub-beams to EUV distribution optical arrays; and distributing simultaneously the secondary EUV sub-beams to scanners.

In one aspect the high-energy primary EUV beam is a free-electron laser beam. In further aspects, a combined energy of the secondary EUV sub-beams is substantially equivalent to energy of the high-energy primary EUV beam. In another aspect, the primary splitting optical assembly and the beam-splitting optical arrays include grazing incidence convex-like toroidal splitting mirrors. In other aspects, the EUV distribution optical arrays include collimating concave-like toroidal mirrors.

Aspects include monitoring power levels of the secondary EUV sub-beams at the scanners; and adjusting dynamically optical elements in the primary splitting optical assembly, the beam-splitting optical arrays, and the EUV distribution optical arrays based on target power levels of the secondary EUV sub-beams at the scanners.

Other aspects include positioning the primary splitting optical assembly in between a source of the high-energy primary EUV beam and the beam-splitting optical arrays. Additional aspects include positioning the beam-splitting optical arrays in between the primary splitting optical assembly and the EUV distribution optical arrays. Further aspects include positioning the EUV distribution optical arrays in between the beam-splitting optical arrays and the scanners.

Another aspect of the present disclosure is a device including: a primary splitting optical assembly to receive and split a high-energy primary EUV beam into primary EUV sub-beams; beam-splitting optical arrays to receive and split the primary EUV sub-beams into secondary EUV sub-beams; and EUV distribution optical arrays to receive and distribute simultaneously the secondary EUV sub-beams to scanners.

In some aspects, the device includes sensors to monitor power levels of the secondary EUV sub-beams at the scanners; and adjusting mechanisms to dynamically adjust optical elements in the primary splitting optical assembly, the beam-splitting optical arrays, and the EUV distribution optical arrays based on target power levels of the secondary EUV sub-beams at the scanners.

In additional aspects of the device, the primary splitting optical assembly positioned in between a source of the high-energy primary EUV beam and the beam-splitting optical arrays. In some aspects of the device, the beam-splitting optical arrays positioned in between the primary splitting optical assembly and the EUV distribution optical arrays. In other aspects of the device, the EUV distribution optical arrays positioned in between the beam-splitting optical arrays and the scanners.

Another aspect of the present disclosure is a method including: receiving a high-energy primary EUV beam at a primary splitting optical assembly, wherein the high-energy primary EUV beam is a free-electron laser beam; splitting the primary EUV beam into primary EUV sub-beams; reflecting the primary EUV sub-beams to beam-splitting optical arrays, wherein the primary splitting optical assembly and the beam-splitting optical arrays include grazing incidence convex-like toroidal splitting mirrors; splitting the primary EUV sub-beams into secondary EUV sub-beams, wherein a combined energy of the secondary EUV sub-beams is substantially equivalent to energy of the high-energy primary EUV beam; reflecting the secondary EUV sub-beams to EUV distribution optical arrays, wherein the EUV distribution optical arrays include collimating concave-like toroidal mirrors; distributing simultaneously the secondary EUV sub-beams to scanners; and adjusting dynamically optical elements in the primary splitting optical assembly, the beam-splitting optical arrays, and the EUV distribution optical arrays based on target power levels of the secondary EUV sub-beams at the scanners.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problems of providing simultaneous EUV beams to photolithography scanners used in fabrication of IC devices. The present disclosure addresses and solves such problems, for instance, by, inter alia, receiving and splitting a high-energy primary EUV (e.g., FEL) beam and simultaneously distributing secondary EUV beams to the photolithography scanners. Although EUV beams are primarily referenced herein, techniques discussed may be applied to any type of high energy photon beam. In some instances, the EUV beam is delivered from a single undulator utilizing a grazing incidence optical assembly including convex-like toroidal metal coated mirrors. Additionally, risk of damage to the beam splitting mirrors/optics is reduced by first dividing and expanding the high-power EUV beam delivered from the FEL by employing only grazing incidence optics where both reflection losses and deposited beam power are minimized, wherein each optical element is easily cooled via water or cryogens to minimize optic warping. Further, sub-fab space is minimized. Furthermore, edge losses associated with split mirrors or rotating optics are eliminated or substantially reduced.

Figure 1A:
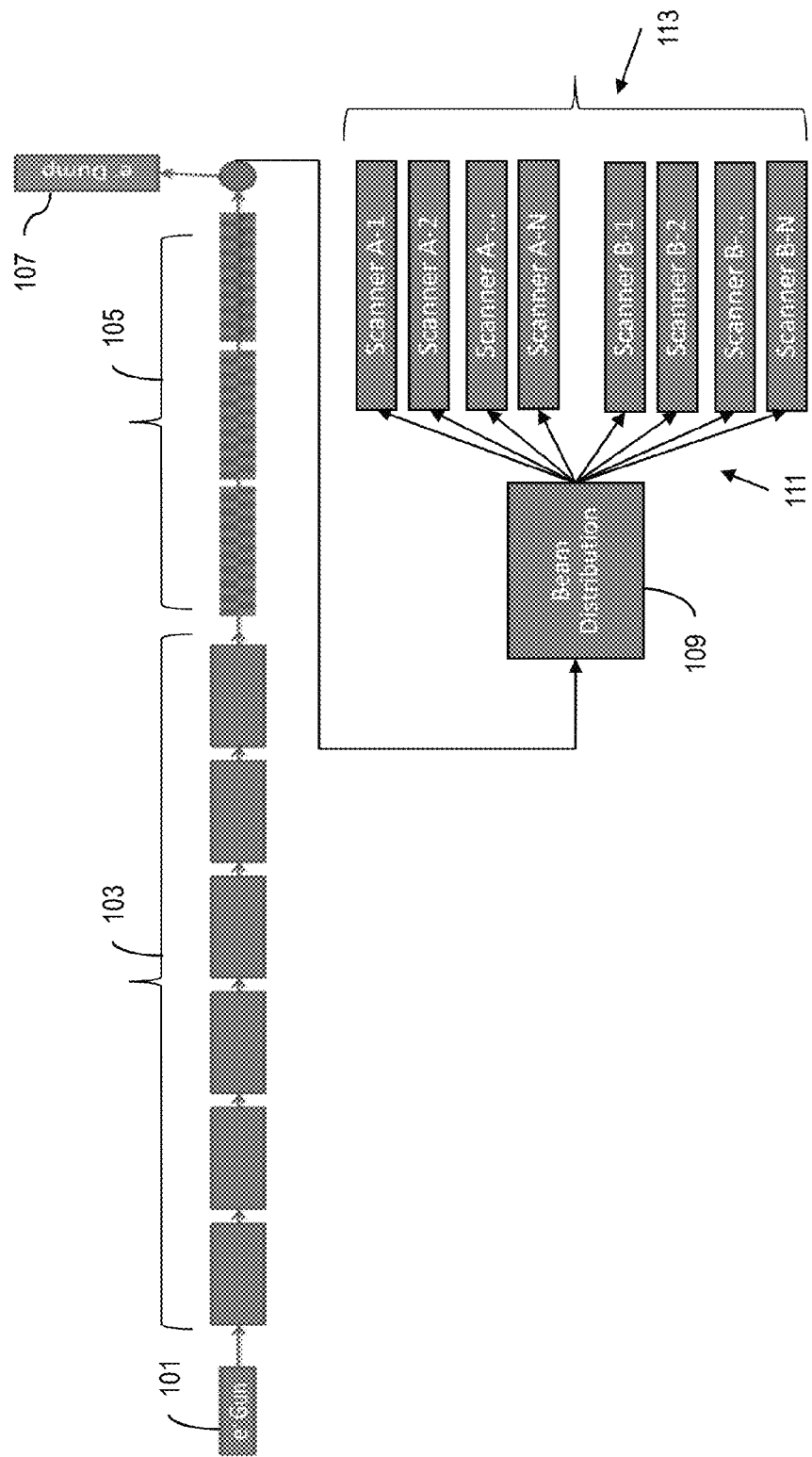
FIG. 1A illustrates example components of a FEL and a beam distribution network.
Figure 1B:
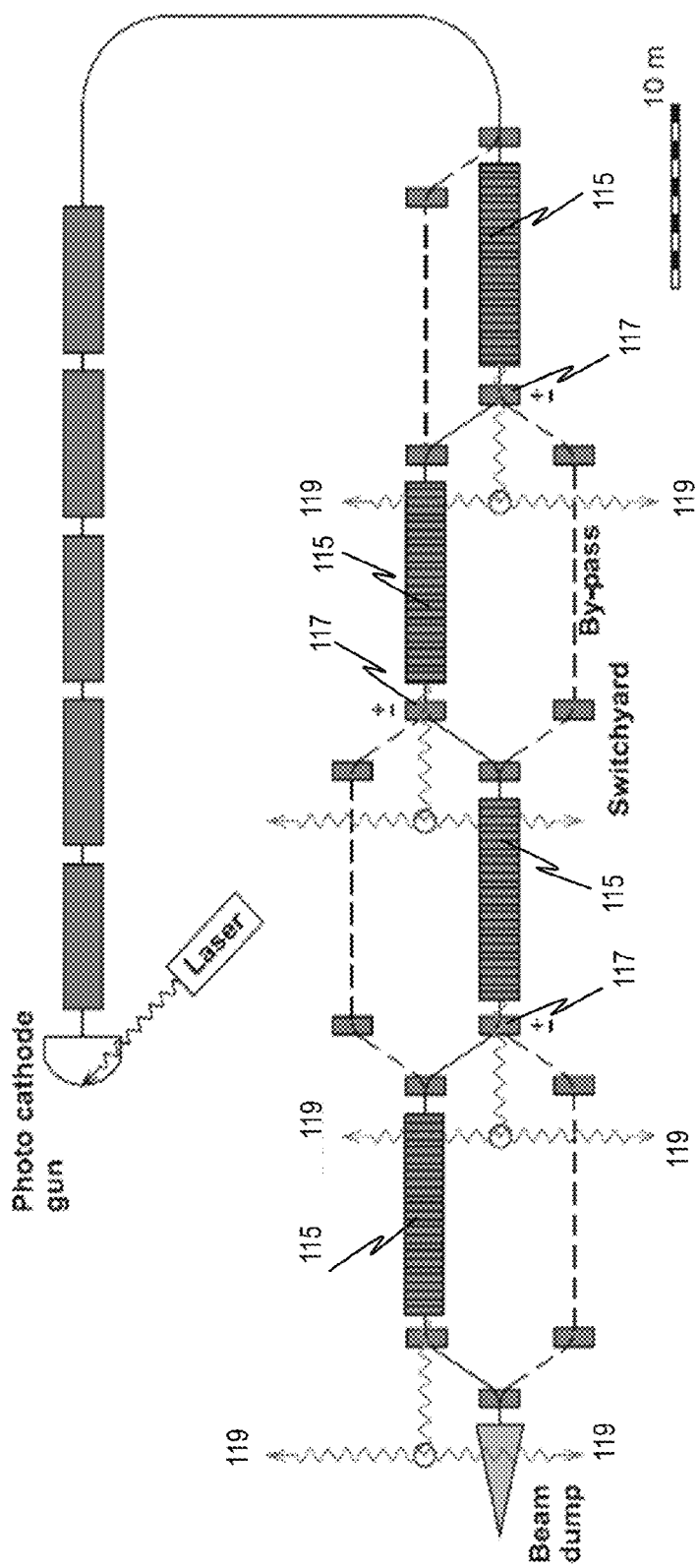
FIGS. 1B through 1D illustrate undulator switchyard, time multiplexing rotating/insertion mirror, and split edge mirrors networks, respectively, which are example beam distribution networks associated with a photolithography process.
Figure 1C:
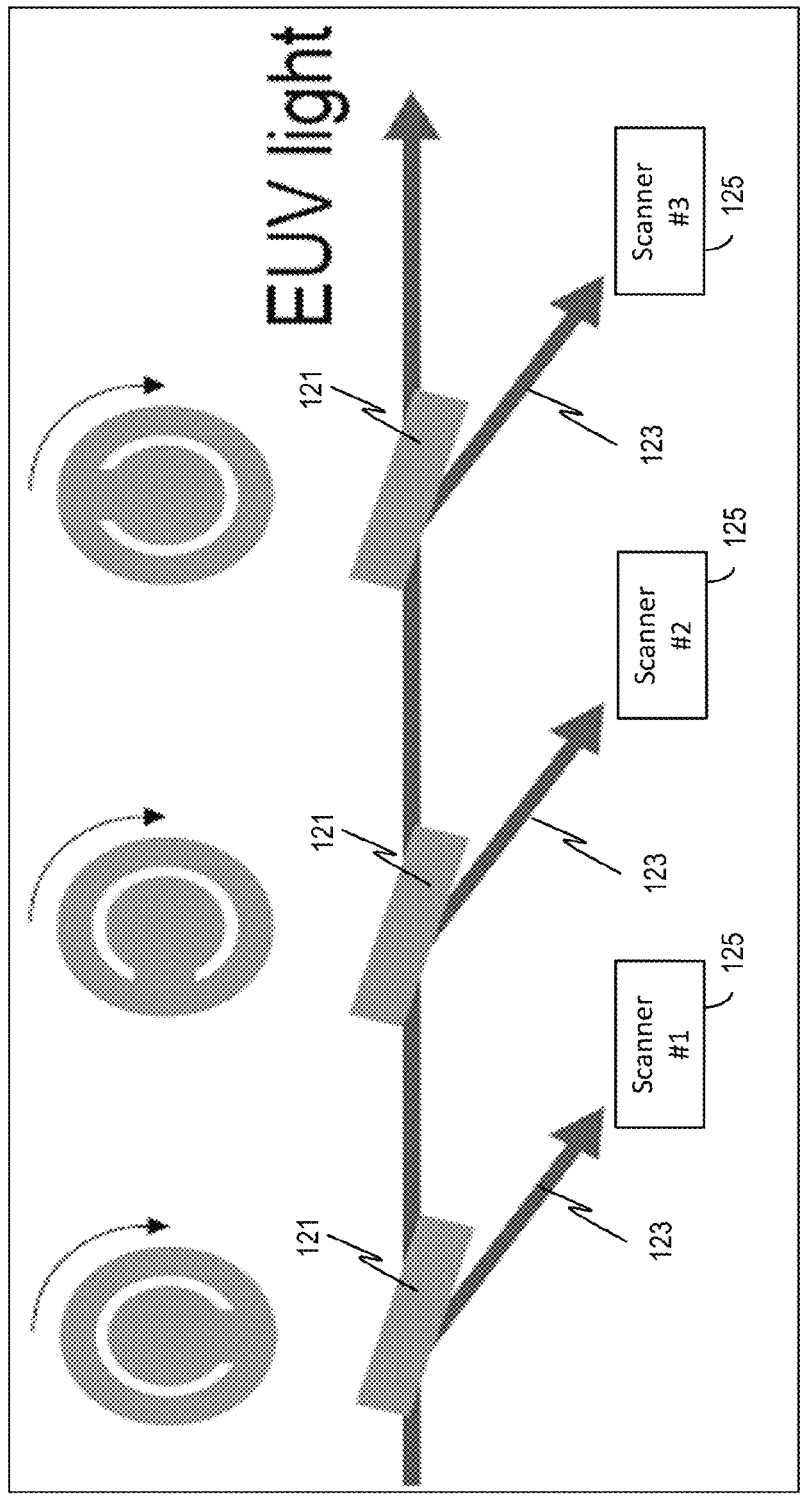
Figure 1D:
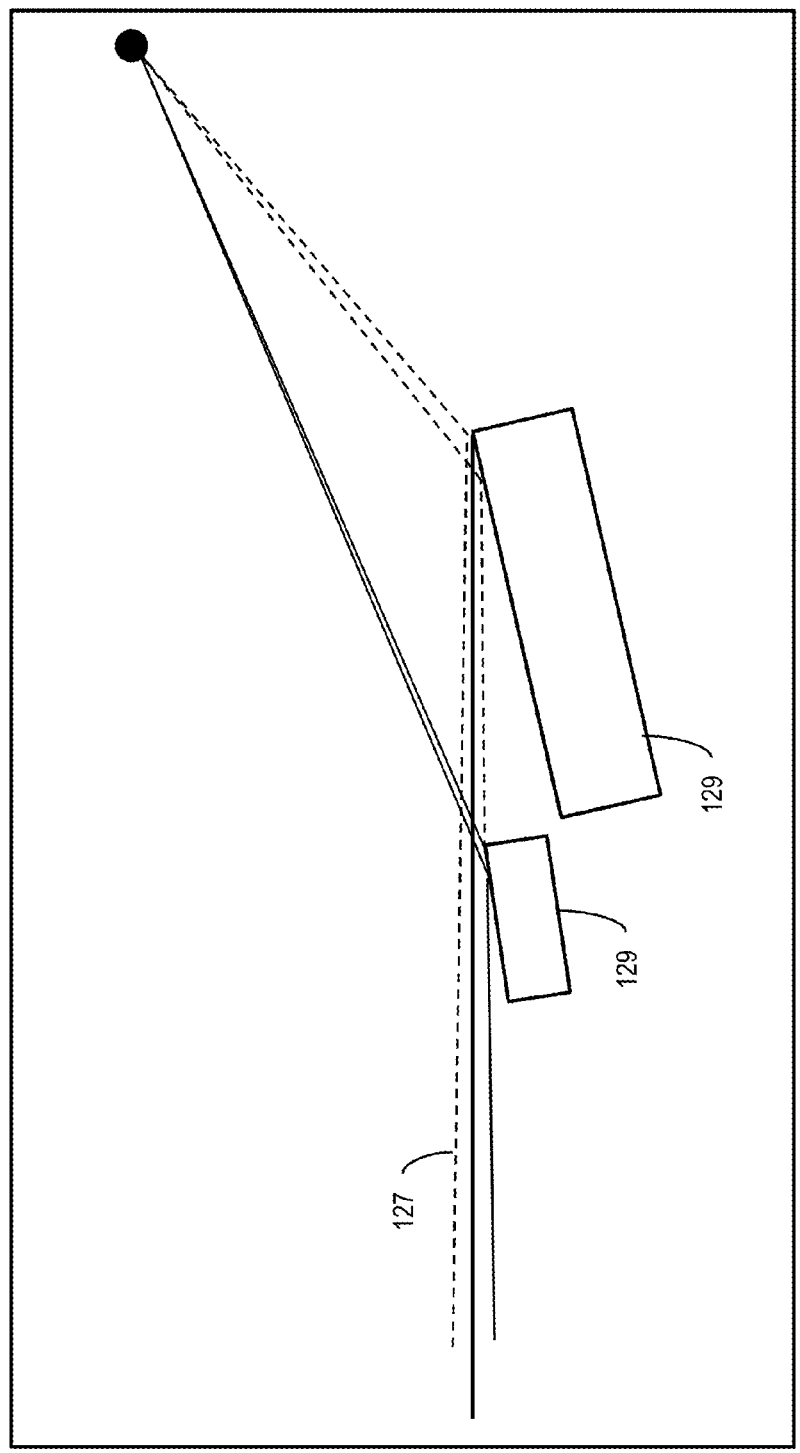
Figure 2:
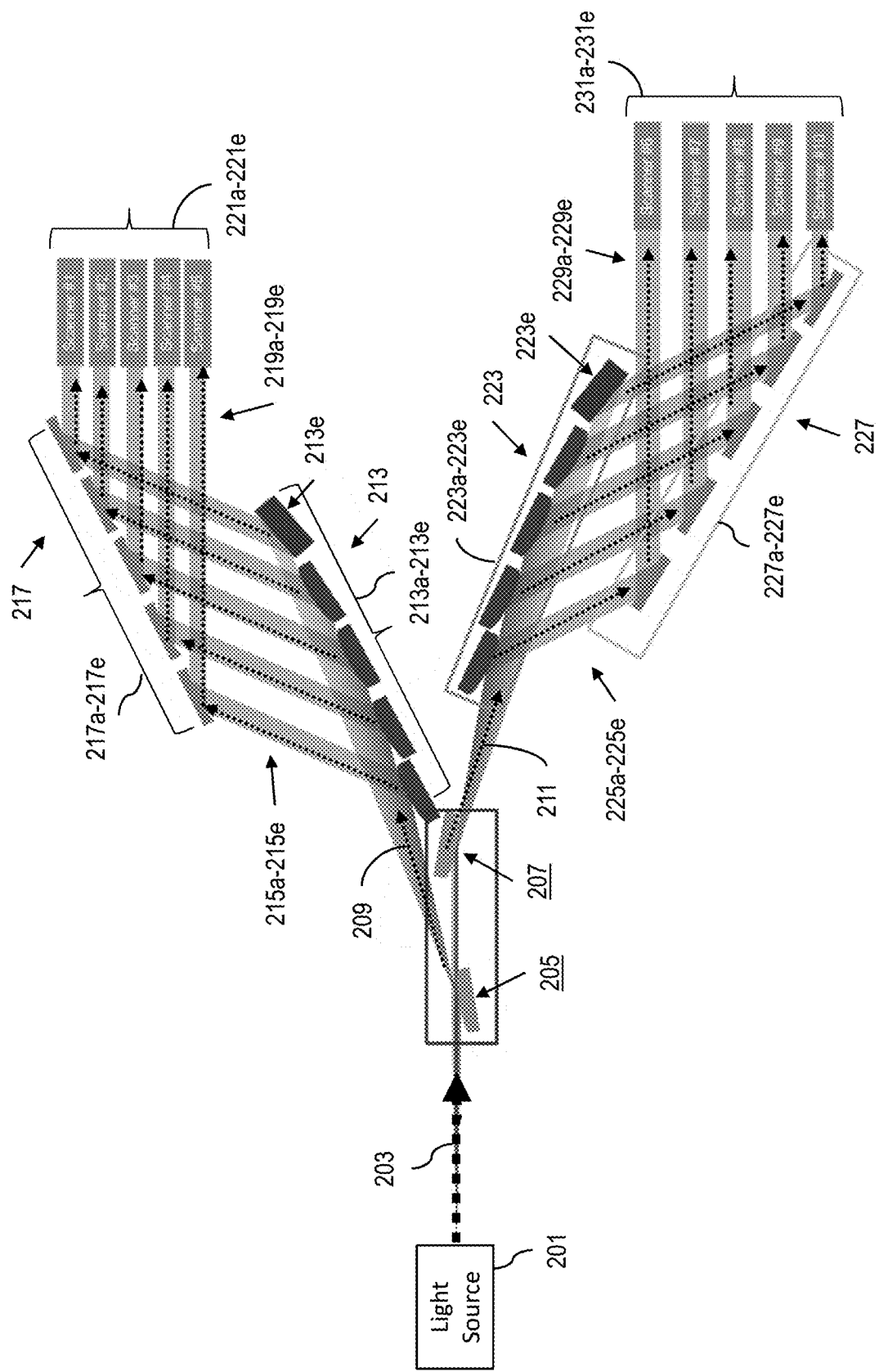
FIG. 2 illustrates an EUV beam distribution network, in accordance with an exemplary embodiment.

FIG. 2 illustrates an EUV beam distribution network that includes a primary EUV (e.g., FEL beam with 13.5 nanometer (nm) wavelength photons) high-energy light source 201 that can provide a multi-kilowatt light beam 203. Additionally, the light beam 203 may reflect onto a plurality of primary convex-like toroidal splitting mirrors 205 and 207, which may split the light beam 203 into two primary EUV sub-beams 209 and 211, which may be substantially equal (e.g., 50/50) but can also be both any ratio totaling near completely the energy of the primary EUV beam as well as being adjustable "on the fly" as to the ratio of the energy of the split primary EUV sub-beams. The convex-like mirrors may be metal coated mirrors. The convex-like mirrors may also be mounted on translation stages so they may be moved in and out of the primary EUV beam thereby adjusting the splitting ratio between the primary EUV sub-beams 209 and 211. The primary EUV sub-beam 209 is reflected onto a splitting array 213 that includes a plurality of convex-like toroidal mirrors 213a through 213e, which may split the primary EUV sub-beam 209 into secondary EUV sub-beams 215a through 215e. Next, the secondary EUV sub-beams 215a through 215e are reflected onto array 217 that includes collimating concave-like toroidal EUV mirrors 217a through 217e, which then distribute EUV sub-beams 219a through 219e to photolithography scanners 221a through 221e. In a similar process, the primary EUV sub-beam 211 may be reflected onto splitting array 223 that includes a plurality of convex-like toroidal mirrors 223a through 223e, which may split the primary EUV sub-beam 211 into secondary EUV sub-beams 225a through 225e. Next, the secondary EUV sub-beams 225a through 225e are reflected onto collimating array 227 that includes collimating concave-like toroidal EUV mirrors 227a through 227e, which then distribute EUV sub-beams 229a through 229e to photolithography scanners 231a through 231e. Flexibility in the curvature (along both axes) of the grazing incidence (less than 30 degrees relative to the surface) for the mirrors allows the EUV beam to be tailored to each scanner's requirements, e.g., each distributed secondary beam may be different, and adjustable positioning of each mirror may allow the power at each scanner to be selectable. In addition, the last convex-like toroidal mirror (e.g., 213e and 223e) in a splitting array (e.g., 213 and 223) may have a different surface curvature (e.g., flat) than the other mirrors in the same splitting array so that the last mirror may receive and reflect the remaining EUV light reflected from the primary splitting mirrors (e.g., 205 and 207). The number of primary splitting mirrors (e.g., 205 and 207), the secondary splitting mirrors in the splitting arrays (e.g., 213 and 223), and the collimating mirrors (e.g., 227a through 227e) may depend on requirements and/or parameters such as power of the primary high-energy light beam (e.g., 203), power required at each photolithography scanner, number of photolithography scanners (e.g., 221a through 221e) to be supported, positioning of the elements of the system, size of the IC fabrication facilities, or the like. Moreover, the optical elements/mirrors may be optimized for reflectivity at a chosen angle with appropriate thermal dissipation characteristics.

Figure 3:
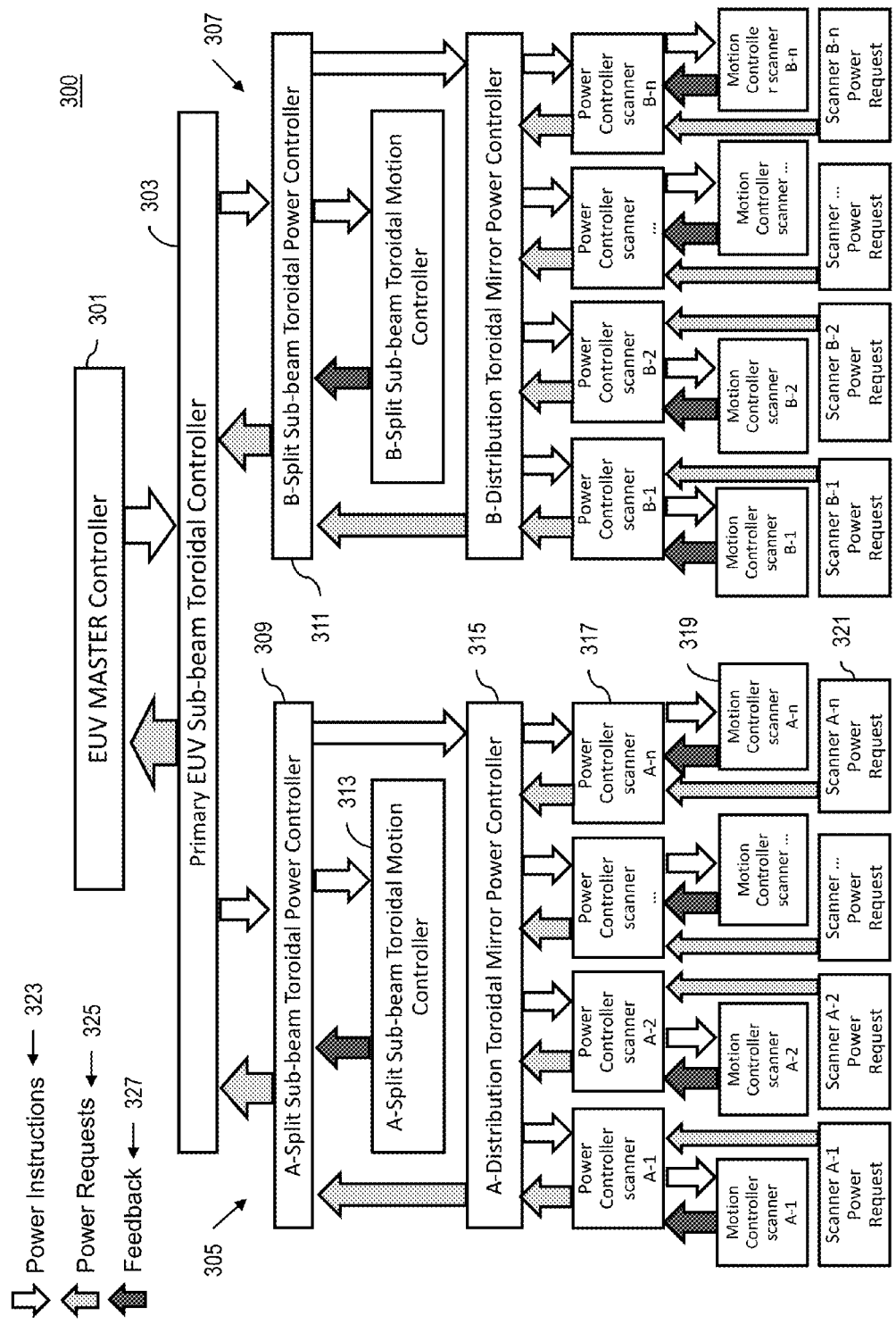
FIG. 3 illustrates an algorithm flow chart associated with an EUV beam distribution network, in accordance with an exemplary embodiment.

FIG. 3 illustrates an algorithm flow chart associated with an EUV beam distribution network, in accordance with an exemplary embodiment. In one example, algorithm 300 may include an EUV master controller 301, a primary EUV sub-beam toroidal controller 303, a plurality of sub-beam split branches, e.g., 305 and 307, that include respective sub-beam toroidal power controllers; e.g., A-split, 309 and B-split, 311. Since the A-split and B-split branches include the same/similar network elements, the A-split branch 305 will be referenced in further discussions below.

The A-split sub-beam toroidal power controller 309 communicates with an A-split sub-beam toroidal motion controller 313 and an A-distribution toroidal mirror power controller 315. Further, the A-distribution toroidal mirror power controller 315 communicates with a plurality of power controllers 317 associated with respective scanners A-1 through A-n. Moreover, the power controllers 317 communicate with their respective motion controllers 319 as well as receive power requests 321 from the respective scanners. The steps of the algorithm 300 may be preconfigured to begin at the EUV master controller 301 for receiving and splitting a high-energy light beam, or the steps may be initiated by the scanner power requests 321. In either case, each network element may function similarly in executing the algorithm steps.

The communications between the network elements may be effectuated via power instructions 323, power requests 325, feedbacks 327 or the like communication messages. The EUV master controller may determine the type (e.g., FEL) and energy of the primary light source 201 and how the light source should be split. For example, based on user or IC fabrication system requirements, the primary light beam 203 may be split into two, three, four, etc. sub-beams. As noted, in the example of FIG. 3, the primary light beam 203 may be split into two sub-beams, the A-split, 305 and the B-split, 307. The EUV master controller 301 may send power instructions 323, which may be based on preconfigured parameters or in response to power requests 325 received from the primary EUV sub-beam toroidal controller 303. The primary EUV sub-beam toroidal controller 303 may communicate (e.g., via a power request 325 or power instructions 323) with the A-split and B-split sub-beam toroidal power controllers 309 and 311 for controlling the primary convex-like toroidal splitting mirrors 205 and 207 for splitting the primary high-energy light beam 203 into two sub-beams 209 and 211. However, as noted, a primary high-energy light beam may be split into a number of sub-beams with equal or different energy levels, which may be based on the IC fabrication system's requirements, for delivery to the scanners. If one scanner requests for more power and another one less, the corresponding toroidal mirrors can slide in and out of the primary beam and sub-beam paths to redirect the appropriate power. The A-split sub-beam toroidal power controller 309 may communicate with the A-split sub-beam toroidal motion controller 313 to provide power instructions or to receive feedback so that the associated toroidal splitting mirror 205 may be positioned properly. Also, A-distribution toroidal mirror power controller 315 may receive power instructions from or provide power requests to the A-split sub-beam toroidal power controller 309. Moreover, the A-distribution toroidal mirror power controller 315 may provide power instructions to or receive power request from the power controllers 317 that are associated with their respective scanners A-1 through A-n. In turn, the power controllers 317 may provide power instructions to or receive feedback from the motion controllers 319 that are associated with the scanners A-1 through A-n. Also, the power controllers 317 may receive power requests 321 from the scanners A-1 through A-n. As noted, the algorithm steps may be initiated by the scanner power requests 321.

Figure 4:
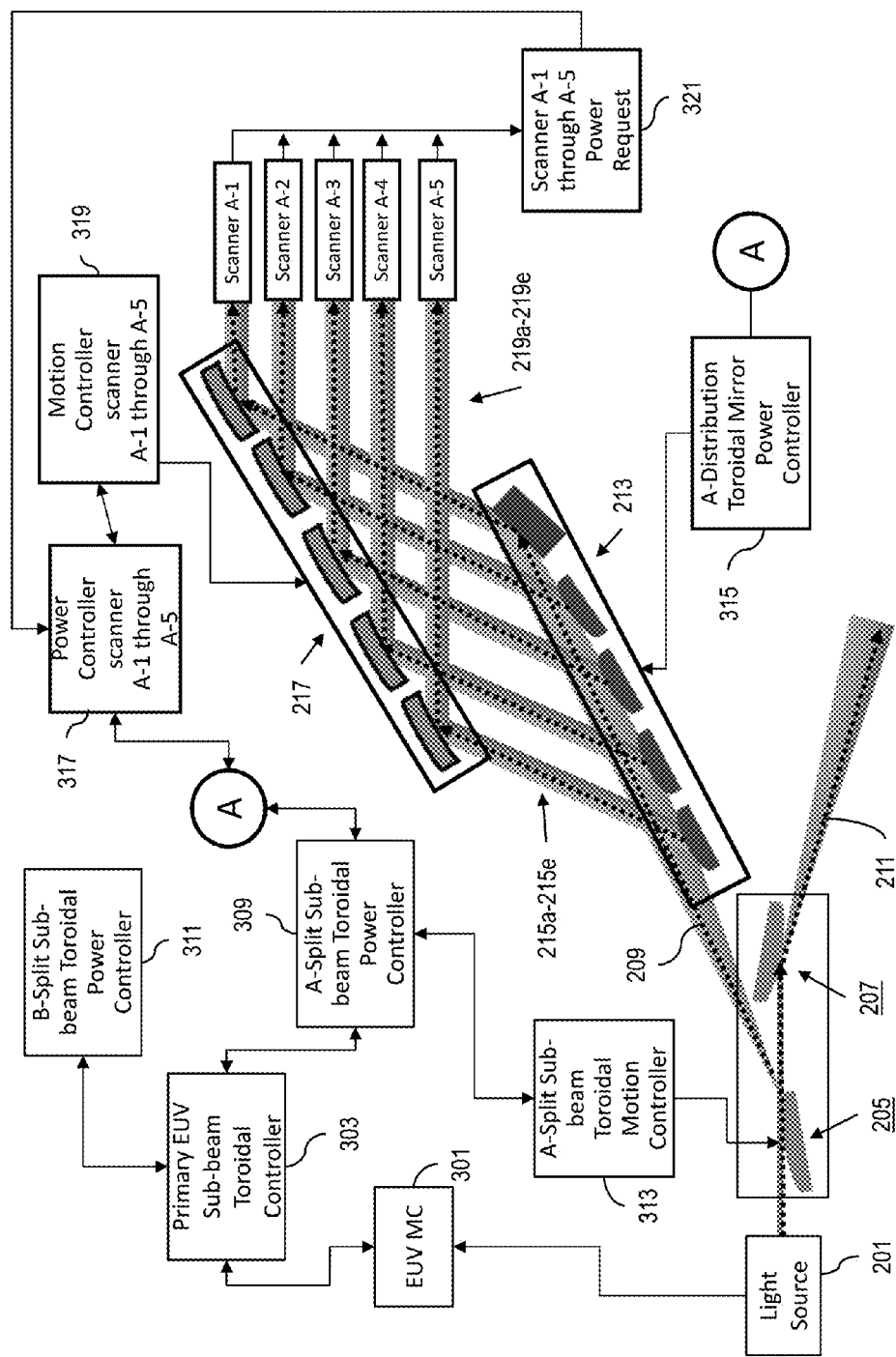
FIG. 4 illustrates an EUV beam distribution network including network control elements, in accordance with an exemplary embodiment.

FIG. 4 illustrates an EUV beam distribution network including network control elements, in accordance with an exemplary embodiment. As illustrated, FIG. 4 includes algorithm elements for A-split sub-beam of FIG. 3 and the associated network elements of FIG. 2, wherein scanners A-1 through A-5 are included as example scanners.

The embodiments of the present disclosure can achieve several technical effects, including receiving and splitting a high-energy primary EUV (e.g., FEL) beam and simultaneously distributing secondary EUV beams to 100% of photolithography scanners. The convex toroidal optics provide a continuous interface for beam splitting. By first dividing and expanding the high-power EUV beam delivered from the FEL, the risk of damage to the beam splitting optics is reduced. Additionally, by employing only grazing incidence optics, both reflection losses and deposited beam power are minimized. Each optic is easily coiled via water or cryogens to minimize optic warping. Edge losses associated with split mirrors or rotating optics and edge reflection artifacts are eliminated, and expansion of the EUV beam at each branching optic allows efficient splitting with low losses. Further, the embodiments enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or other devices utilizing logic or high-voltage technology nodes. The present disclosure therefore enjoys industrial applicability in any of various types of highly integrated semiconductor devices, including devices that use SRAM memory cells (e.g., liquid crystal display (LCD) drivers, synchronous random access memories (SRAM), digital processors, etc.), particularly for 10 nm technology node devices and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
receiving a high-energy primary extreme ultraviolet (EUV) beam at a primary splitting optical assembly;
splitting the primary EUV beam into primary EUV sub-beams;
reflecting the primary EUV sub-beams to beam-splitting optical arrays;
splitting the primary EUV sub-beams into secondary EUV sub-beams;
reflecting the secondary EUV sub-beams to EUV distribution optical arrays; and
distributing simultaneously the secondary EUV sub-beams to scanners.

2. The method of claim 1, wherein the high-energy primary EUV beam is a free-electron laser beam.

3. The method claim 1, wherein a combined energy of the secondary EUV sub-beams is substantially equivalent to energy of the high-energy primary EUV beam.

4. The method claim 1, wherein the primary splitting optical assembly and the beam-splitting optical arrays include grazing incidence convex-like toroidal splitting mirrors.

5. The method of claim 1, wherein the EUV distribution optical arrays include collimating concave-like toroidal mirrors.

6. The method of claim 1, further comprising:
monitoring power levels of the secondary EUV sub-beams at the scanners; and
adjusting dynamically optical elements in the primary splitting optical assembly, the beam-splitting optical arrays, and the EUV distribution optical arrays based on target power levels of the secondary EUV sub-beams at the scanners.

7. The method of claim 1, further comprising:
positioning the primary splitting optical assembly in between a source of the high-energy primary EUV beam and the beam-splitting optical arrays.

8. The method of claim 1, further comprising:
positioning the beam-splitting optical arrays in between the primary splitting optical assembly and the EUV distribution optical arrays.

9. The method of claim 1, further comprising:
positioning the EUV distribution optical arrays in between the beam-splitting optical arrays and the scanners.

10. A device comprising:
a primary splitting optical assembly to receive and split a high-energy primary extreme ultraviolet (EUV) beam into primary EUV sub-beams;
beam-splitting optical arrays to receive and split the primary EUV sub-beams into secondary EUV sub-beams; and
EUV distribution optical arrays to receive and distribute simultaneously the secondary EUV sub-beams to scanners.

11. The device of claim 10, wherein the high-energy primary EUV beam is a free-electron laser beam.

12. The device claim 10, wherein a combined energy of the secondary EUV sub-beams is substantially equivalent to energy of the high-energy primary EUV beam.

13. The device claim 10, wherein the primary splitting optical assembly and the beam-splitting optical arrays include grazing incidence convex-like toroidal splitting mirrors.

14. The device of claim 10, wherein the EUV distribution optical arrays include collimating concave-like toroidal mirrors.

15. The device of claim 10, further comprising:
sensors to monitor power levels of the secondary EUV sub-beams at the scanners; and
adjusting mechanisms to dynamically adjust optical elements in the primary splitting optical assembly, the beam-splitting optical arrays, and the EUV distribution optical arrays based on target power levels of the secondary EUV sub-beams at the scanners.

16. The device of claim 10, further comprising:
the primary splitting optical assembly positioned in between a source of the high-energy primary EUV beam and the beam-splitting optical arrays.

17. The device of claim 10, further comprising:
the beam-splitting optical arrays positioned in between the primary splitting optical assembly and the EUV distribution optical arrays.

18. The device of claim 10, further comprising:
the EUV distribution optical arrays positioned in between the beam-splitting optical arrays and the scanners.

19. A method comprising:
receiving a high-energy primary extreme ultraviolet (EUV) beam at a primary splitting optical assembly, wherein the high-energy primary EUV beam is a free-electron laser beam;

splitting the primary EUV beam into primary EUV sub-beams;

reflecting the primary EUV sub-beams to beam-splitting optical arrays, wherein the primary splitting optical assembly and the beam-splitting optical arrays include grazing incidence convex-like toroidal splitting mirrors;

splitting the primary EUV sub-beams into secondary EUV sub-beams, wherein a combined energy of the secondary EUV sub-beams is substantially equivalent to energy of the high-energy primary EUV beam;

reflecting the secondary EUV sub-beams to EUV distribution optical arrays, wherein the EUV distribution optical arrays include collimating concave-like toroidal mirrors;

distributing simultaneously the secondary EUV sub-beams to scanners;

monitoring power levels of the secondary EUV sub-beams at the scanners; and adjusting dynamically optical elements in the primary splitting optical assembly, the beam-splitting optical arrays, and the EUV distribution optical arrays based on target power levels of the secondary EUV sub-beams at the scanners.

20. The method of claim 19, further comprising:

positioning the primary splitting optical assembly in between a source of the high-energy primary EUV beam and the beam-splitting optical arrays;

positioning the beam-splitting optical arrays in between the primary splitting optical assembly and the EUV distribution optical arrays; and positioning the EUV distribution optical arrays in between the beam-splitting optical arrays and the scanners.

* * * * *